United States Patent
Koo et al.

(10) Patent No.: US 9,111,992 B2
(45) Date of Patent: Aug. 18, 2015

(54) SEMICONDUCTOR DEVICE INCLUDING AN N-WELL STRUCTURE

(75) Inventors: Jeoung Mo Koo, Singapore (SG); Purakh Raj Verma, Singapore (SG); Guowei Zhang, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 247 days.

(21) Appl. No.: 13/231,934

(22) Filed: Sep. 13, 2011

(65) Prior Publication Data
US 2013/0062691 A1 Mar. 14, 2013

(51) Int. Cl.
*H01L 29/72* (2006.01)
*H01L 21/762* (2006.01)
*H01L 29/78* (2006.01)
*H01L 29/10* (2006.01)
*H01L 21/265* (2006.01)
*H01L 29/06* (2006.01)
*H01L 21/8238* (2006.01)

(52) U.S. Cl.
CPC .... *H01L 21/76224* (2013.01); *H01L 21/26513* (2013.01); *H01L 29/10* (2013.01); *H01L 29/1079* (2013.01); *H01L 29/1083* (2013.01); *H01L 29/7835* (2013.01); *H01L 21/823892* (2013.01); *H01L 29/0653* (2013.01); *H01L 29/1087* (2013.01)

(58) Field of Classification Search
CPC .............................................. H01L 29/66659
USPC .................................................. 438/286, 478
See application file for complete search history.

(56) References Cited

U.S. PATENT DOCUMENTS 5,556,796 A * 9/1996 Garnett et al. ................ 438/294
6,180,978 B1 * 1/2001 Chatterjee et al. ............ 257/327

* cited by examiner

*Primary Examiner* — Edward Wojciechowicz
(74) *Attorney, Agent, or Firm* — Horizon IP Pte. Ltd.

(57) ABSTRACT

A device comprising a p-type base region, and a p-type region formed over the p-type base region and in contact with the p-type base region is disclosed. The device also includes an n-well region surrounded by the p-type region, wherein the n-well is formed from an n-type epitaxial layer and the p-type region is formed by counter-doping the same n-type epitaxial layer.

20 Claims, 15 Drawing Sheets

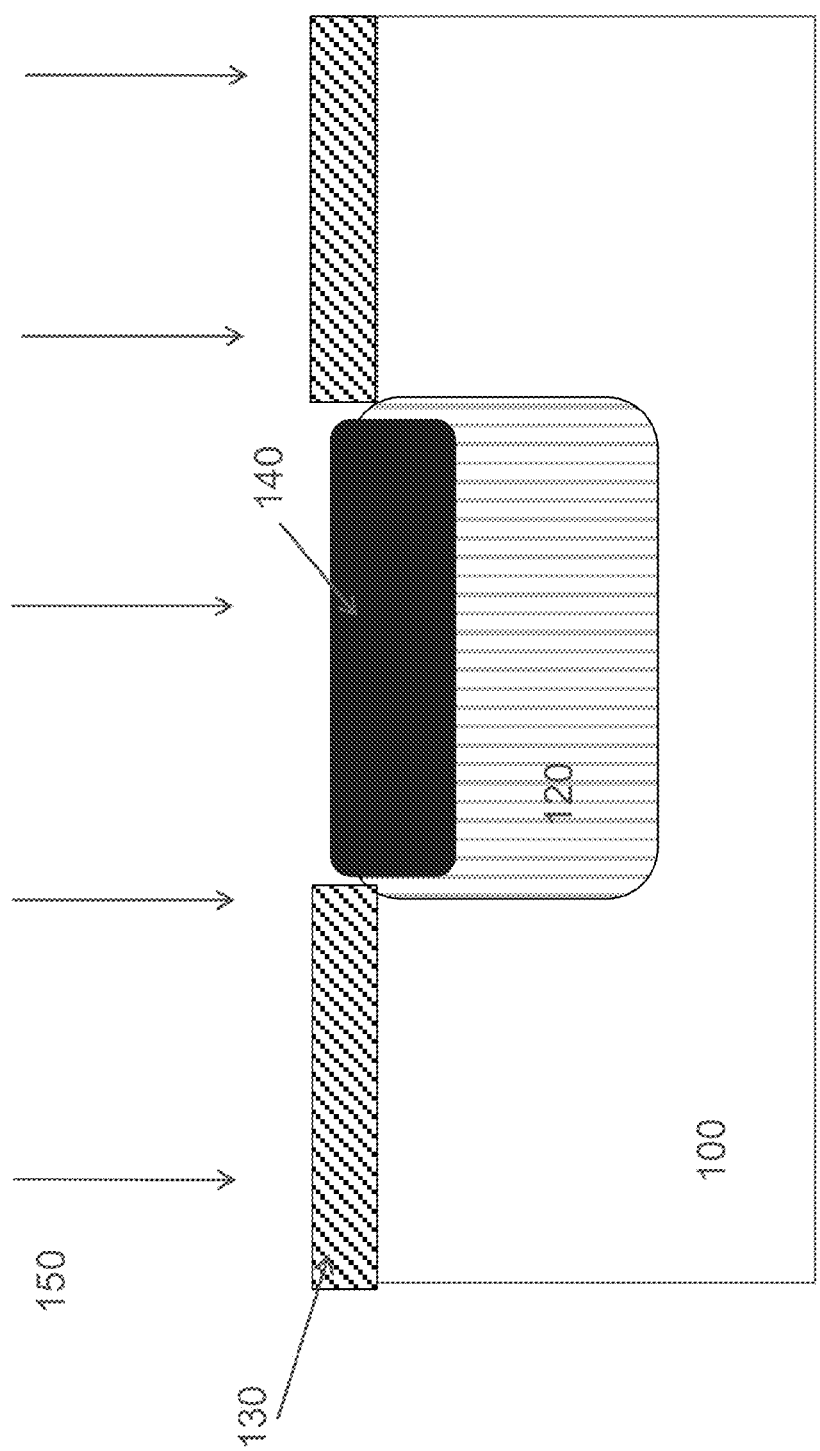

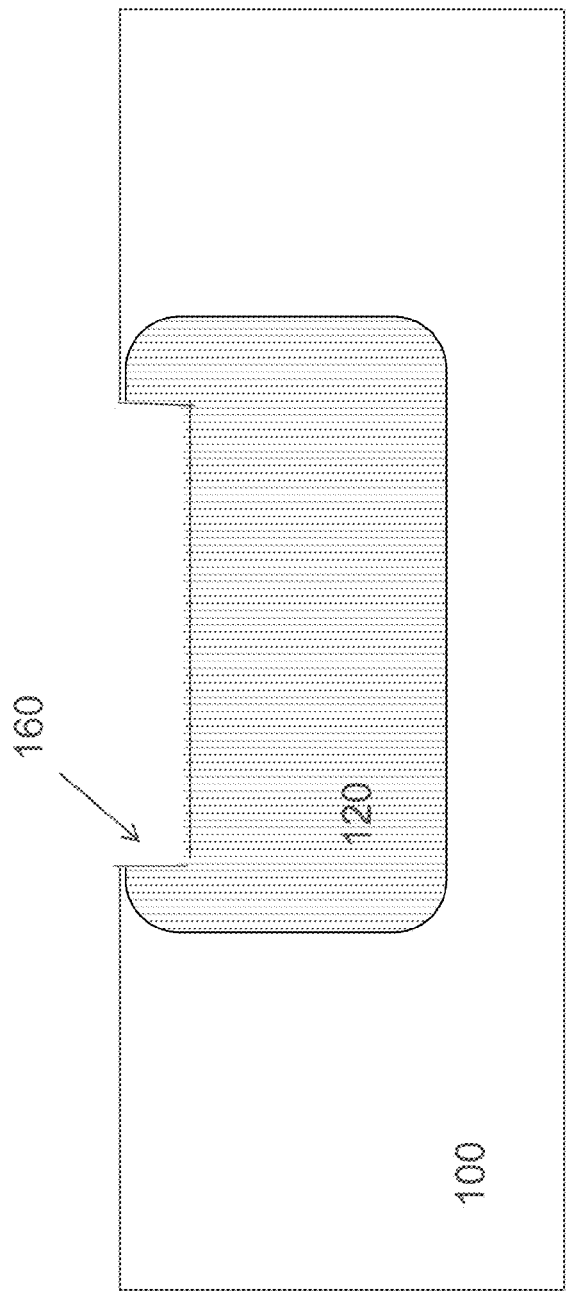
Fig. 1b – Prior Art

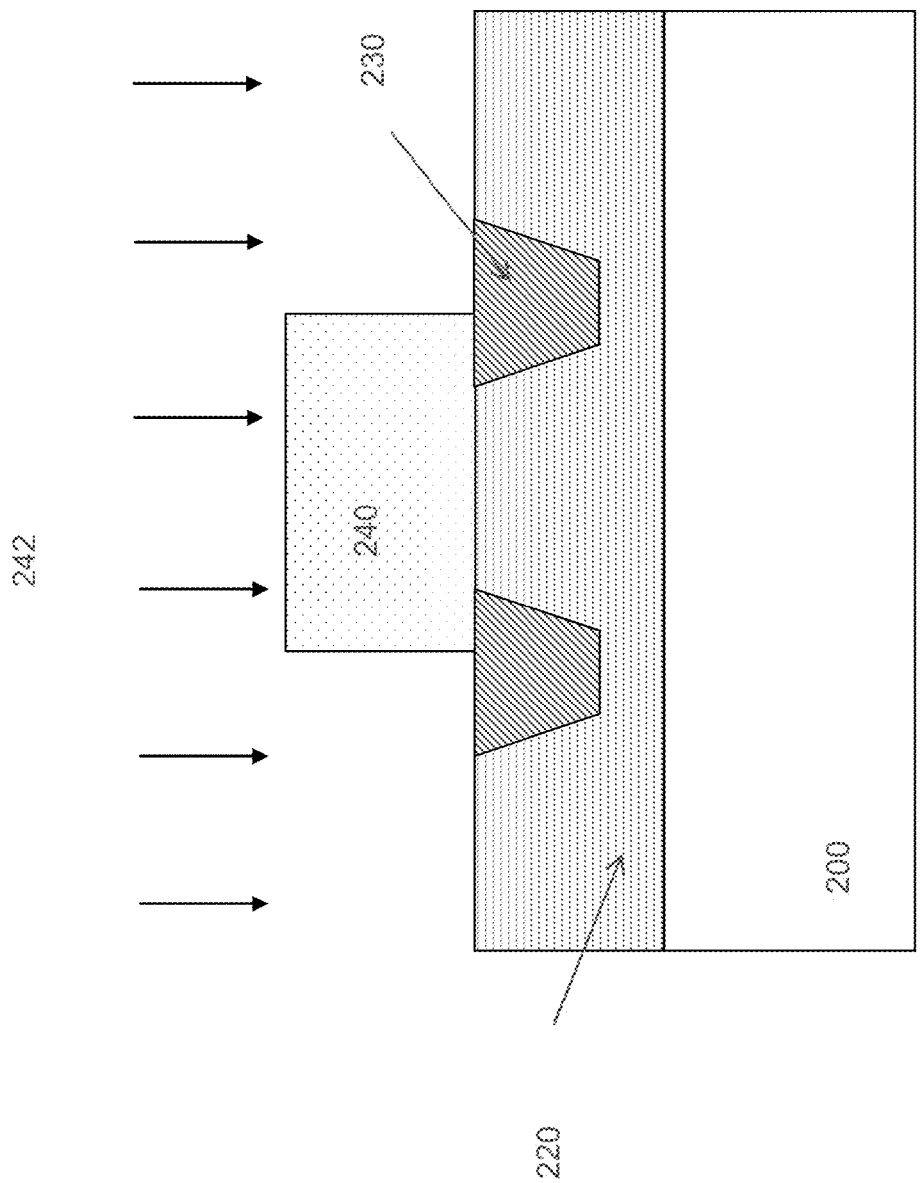

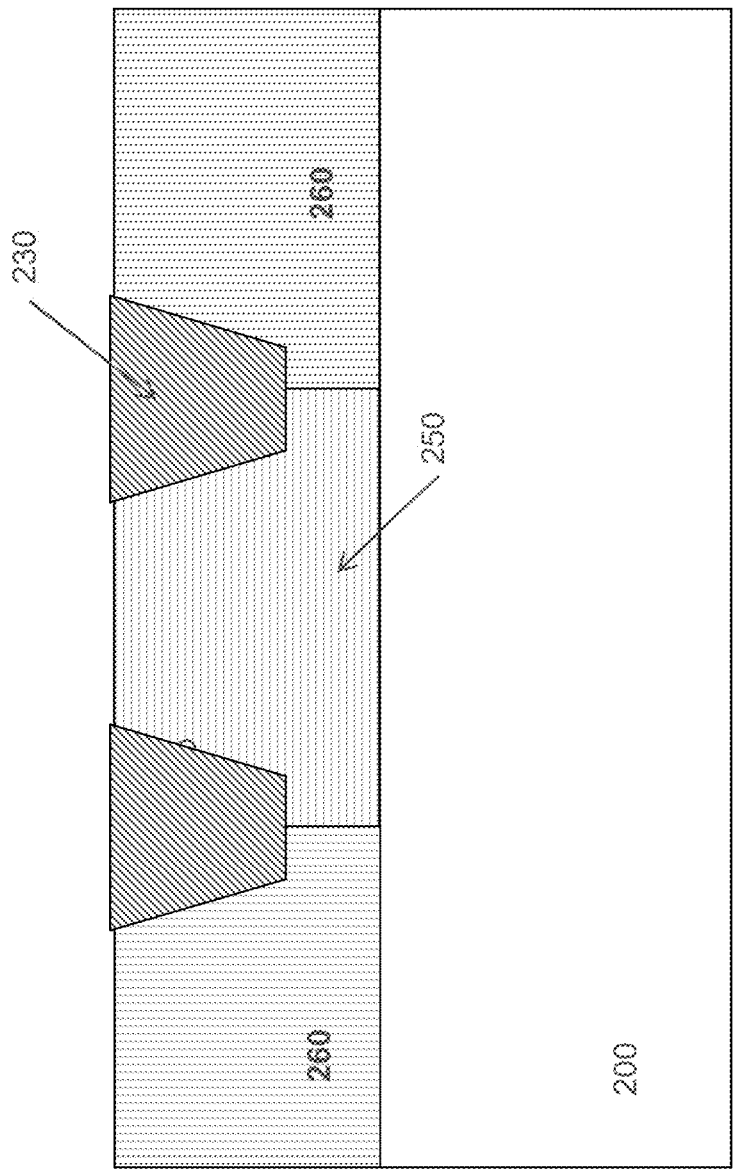

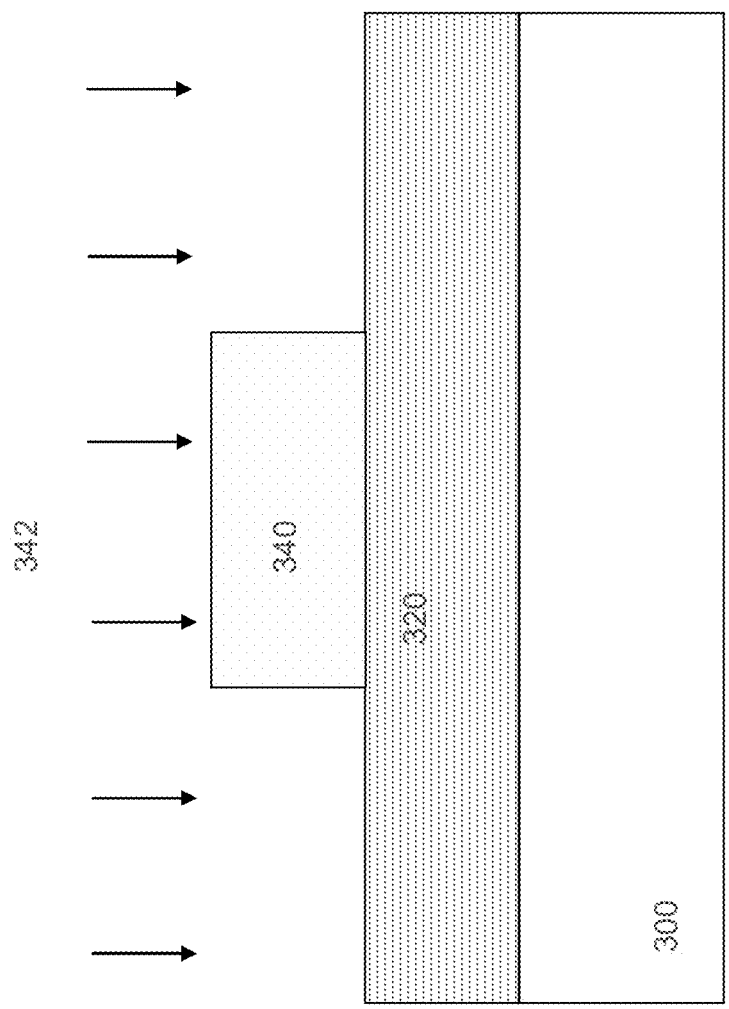

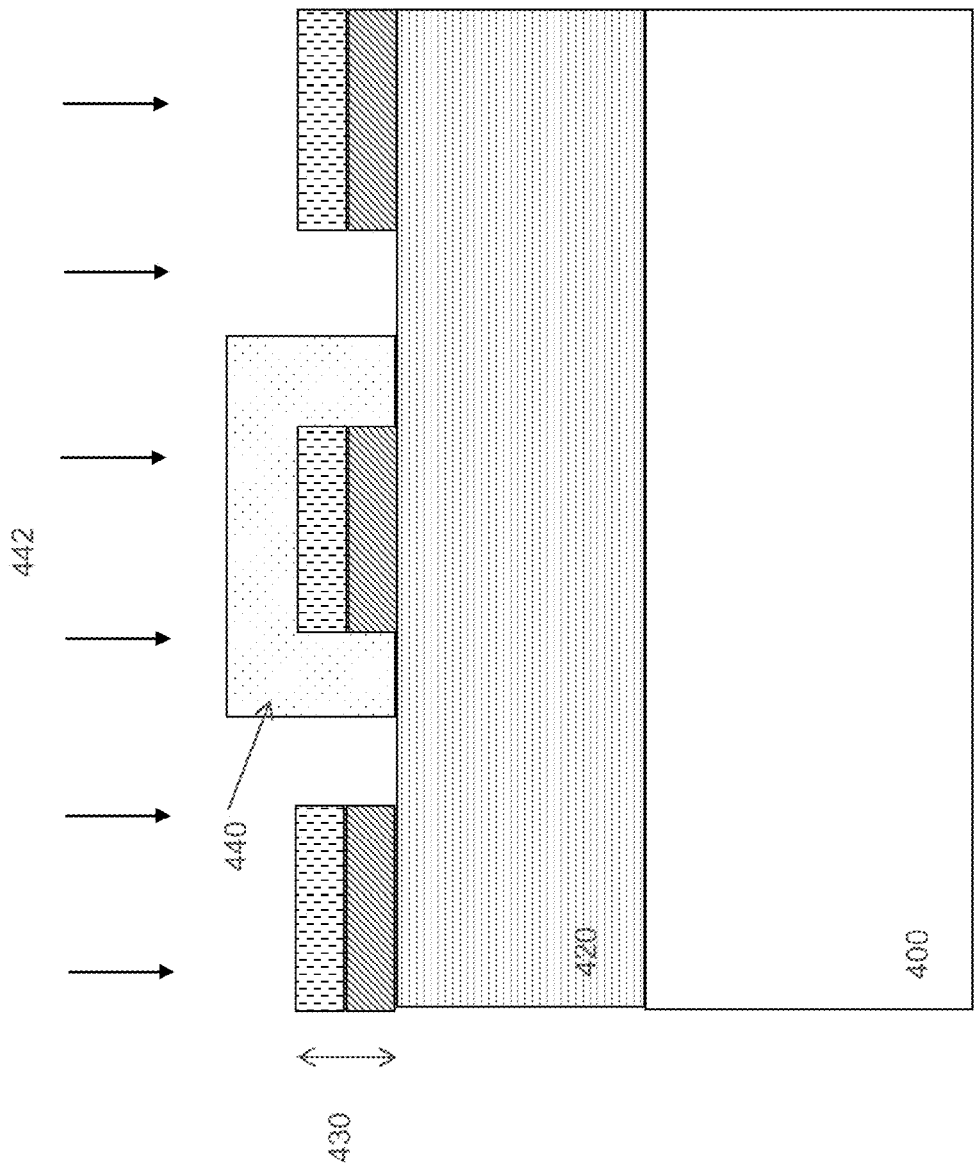

SEMICONDUCTOR DEVICE INCLUDING AN N-WELL STRUCTURE

FIELD OF THE INVENTION

The present invention relates generally to devices including deep n-well structures, and methods for the formation thereof.

BACKGROUND

Deep n-well structures are useful as a means to provide improved device isolation and reduce substrate leakage of devices such as NMOS. They are commonly used in integrated circuits with devices designed for analog or high voltage applications. The depth of a deep n-well, may for example range between 5-15 μm. Such a depth, may be suitable for devices operating from about 10-100 V. Forming a deep device well having other depths may also be useful depending on the device type and desired device performance.

FIG. 1a illustrates a known method for forming a deep n-well 120 in a p-type silicon substrate 100. In this method, a masking layer 130 comprising a pad oxide and an overlying nitride layer are formed on a substrate 100. The masking layer is selected so that dopants do not penetrate through during a subsequent deep n-well implant process. An opening located over the desired deep n-well region is formed in the masking layer 130 by forming a photoresist pattern (not shown) over the masking layer and etching through exposed portions of the masking layer. N-type dopants 150 such as phosphorus or arsenic are then injected into the substrate through the opening in the masking layer 130 in deep n-well implant process 150. In order to place n-type dopants at a sufficient depth within the substrate, the deep n-well implant process typically comprises one or more high energy implant steps. This is followed by a high temperature drive-in process in an oxidizing ambient. The drive-in process is configured to effectuate the diffusion of deep n-well dopants to the desired depth and as such requires a high thermal cycle. It typically requires a processing time of 30 hours or more to form the deep n-well at around 10 um. A drive-in oxide 140 is grown over the deep n-well region during the drive-in process.

FIG. 1b shows the semiconductor structure of FIG. 1a after the drive-in oxide 140 is removed. Consumption of the silicon substrate during the drive-in oxide formation results in the substrate surface overlying the deep n-well being recessed with respect to the substrate surface of adjacent regions. Since the drive-in process is lengthy, the recess can be of significant depth and as such be an undesirable artifact. For example, the recess 160 can cause depth of focus problems during photolithography exposure, and increase the complexity of shallow trench isolation (STI) formation since STI fill material located in substrate trenches of different heights need to be recessed.

In addition to the above, the long high temperature drive-in process in the above described in the known method can also lead to problems like wafer warpage. Therefore, it is desirable to provide an improved method for forming deep n-well structures.

SUMMARY

A method of forming a device is disclosed. The method comprises providing a p-type base region, depositing an n-type epitaxial layer over the p-type base region and selectively counter-doping portions of the epitaxial layer to form a p-type region that surrounds an area of the epitaxial layer that is not counter-doped. The p-type region extends through the epitaxial layer to make contact with the p-type base region so that the surrounded area of the epitaxial layer functions as an n-well region.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 1a to 1b show cross-sectional views of a known process for forming a deep n-well;

FIGS. 2a to 2e show cross-sectional views of a process for manufacturing a semiconductor device in accordance with an embodiment of the invention device;

FIGS. 3a to 3b show cross-sectional views of a process for manufacturing a semiconductor device in accordance with another embodiment of the invention device;

FIGS. 4a to 4b show cross-sectional views of a process for manufacturing a semiconductor device in accordance with an embodiment of the invention device;

DETAILED DESCRIPTION

Figure 2A:
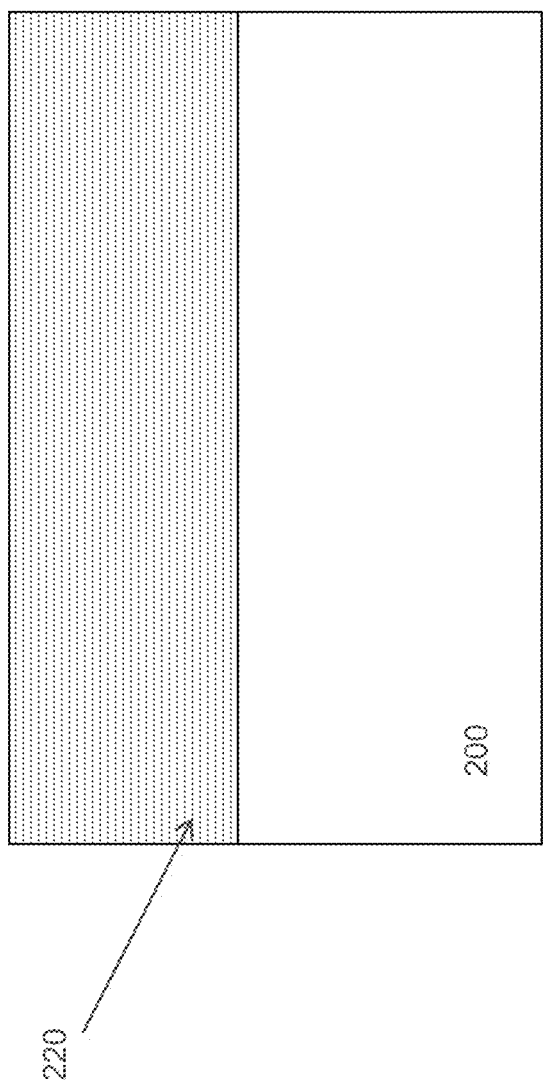

FIGS. 2a-d are cross-sectional views illustrating process steps for fabricating a semiconductor device according to one embodiment of the present invention. Referring to FIG. 2a, a substrate 200 is provided. The substrate may comprise a silicon substrate, such as a p-type doped silicon substrate. For example, the substrate may be lightly doped p-type substrate with a resistivity greater than 1 ohm-cm, preferably between 5-15 ohm-cm. A highly doped p-type silicon substrate with a resistivity of less than 0.1 ohm-cm may also be suitable depending on the technical specifications required. A lightly doped p-type silicon substrate is generally available at a lower cost while a heavily doped p-type substrate provides better latchup immunity for devices fabricated thereon. Other types of substrates, including silicon germanium or silicon-on-insulator (SOI), are also useful.

An n-type epitaxial layer 220 is formed over the substrate 200. The thickness of the epitaxial layer 220 is chosen based on the desired depth of the subsequently formed deep n-well. In one embodiment, the epitaxial layer 220 has a thickness of between 5-15 μm. Such a depth, for example, may be suitable for devices with an operating voltage of 10-100 V. Other thicknesses may also be suitable depending the type of device to be formed and desired performance parameters. In one embodiment, the epitaxial layer 220 is a lightly doped n-type epitaxial layer. A combination of Phosphine and silane gas may be used to grow an n-type epitaxial layer with the Phosphine gas flow being adjusted to achieve the desired doping concentration and layer resistivity.

Figure 2B:
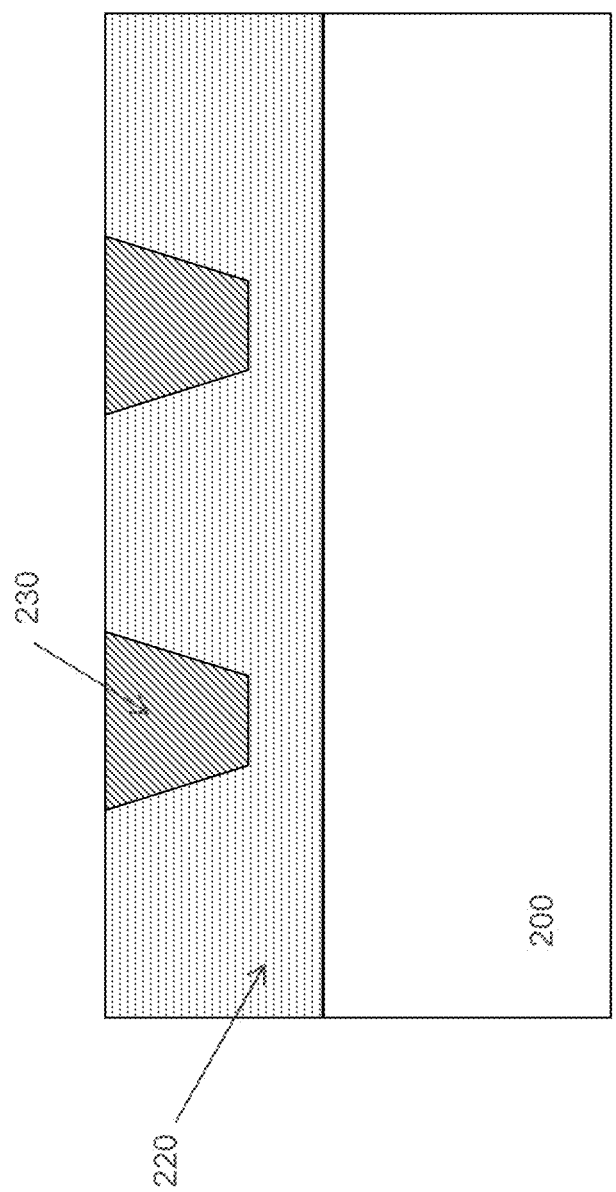

FIG. 2b shows the structure of FIG. 2a after shallow trench isolation (STI) structures 230 are formed within the n-type epitaxial layer 220. The STI structures useful as device isolation regions that separate adjacent devices. In addition to this, the STI structures can also be internal device isolation regions used to separate a single device region into two or more sub-regions. The STI structures may be formed by known methods such as using etch and mask techniques to form trenches within the n-type epitaxial layer 220 and filling the trenches with one or more layers of dielectric material such as silicon oxide. Chemical mechanical polishing (CMP) can be performed to remove trench dielectric material residing outside of the trenches and provide a planar top surface for the STI. Alternatively, other processes or materials can also be used to form the STIs. The depth of the STIs may be, for example, about 3000-4500 Å. Other depths for the STIs may also be useful. Although the STIs in FIG. 2b have a shallower depth compared to the n-type epitaxial layer 220, the STIs may also be of the same depth or deeper than the epitaxial layer 220. Furthermore, it is also to be appreciated that other forms of isolation region such as deep trench isolation and LOCOS structures may also be used in place of STI structures.

In FIG. 2c, a masking layer 240 is formed overlying portions of the n-epitaxial layer that are designated as deep n-well regions. In one embodiment, the masking layer 240 is a photoresist mask that is formed by depositing a photoresist material over the epitaxial layer 220 and patterning the photoresist material using standard lithographic techniques so that portions of the photoresist material that overlie designated deep n-well regions are retained.

P-type dopants are subsequently implanted into the epitaxial layer 220 in a reverse deep n-well implant process 242. During the reverse deep n-well process, the designated deep n-well regions are shielded by the masking layer 240 and implanted dopants are prevented from penetrating through to the epitaxial layer. As a result, the designated deep n-well regions remain n-type in polarity. On the other hand, non-masked areas are doped by the p-type dopants being implanted. The reverse deep n-well implant dosage should be sufficient to at least counter dope the non-masked areas, converting them to p-type regions. Additionally, the implant dose may be selected to take into account the resulting p-type region resistivity that is desired. The reverse deep n-well implant process may comprise one or more implant steps. In one embodiment, multiple implants are carried out at different implant energies.

Following the reverse deep n-well implant, the masking layer 240 is removed and a drive-in anneal process is carried out to diffuse the implanted p-type dopants. The drive-in process may comprise one or more anneal steps which can be performed in a single equipment or multiple pieces of equipment. In one embodiment, the drive-in anneal is a thermal drive-in performed in a furnace. The drive-in anneal can be performed at a temperature of about 1000° c. to 1200° c. Other annealing temperatures and processes may also be suitable and the drive-in anneal may also comprise a plurality of anneal treatments that are carried out at different points in the fabrication process.

As shown in FIG. 2d, the dopants are driven into the epitaxial layer 220 to form p-type regions 260 that extend to at least the top surface of the underlying p-type substrate 200. The p-type regions may also be of a greater depth than the n-type epitaxial layer and extend into the p-type substrate. The n-type epitaxial region 250 sandwiched between the p-type regions 260 acts as the deep n-well region. By having the p-type region extend to at least the top surface of the underlying p-type substrate 200, it is possible to bias the substrate 200 by making contact with a top surface of the p-type regions 260. The deep n-well is also isolated from neighboring deep n-wells as a result of the p-type region extension. In known processes, a deep n-well is formed by implanting n-type dopants into selected portion of a p-type substrate and annealing the substrate the diffuse the n-type dopants to the desired deep n-well depth. By contrast, a deep n-well in the present invention is formed by providing an n-type epitaxial layer. It is instead the surrounding p-type regions that are formed by counter-doping portions of the n-type epitaxial layer. The deep n-well depth is therefore determined by the thickness of the epitaxial layer and not implant and drive-in processes like in the prior art.

Figure 2E:
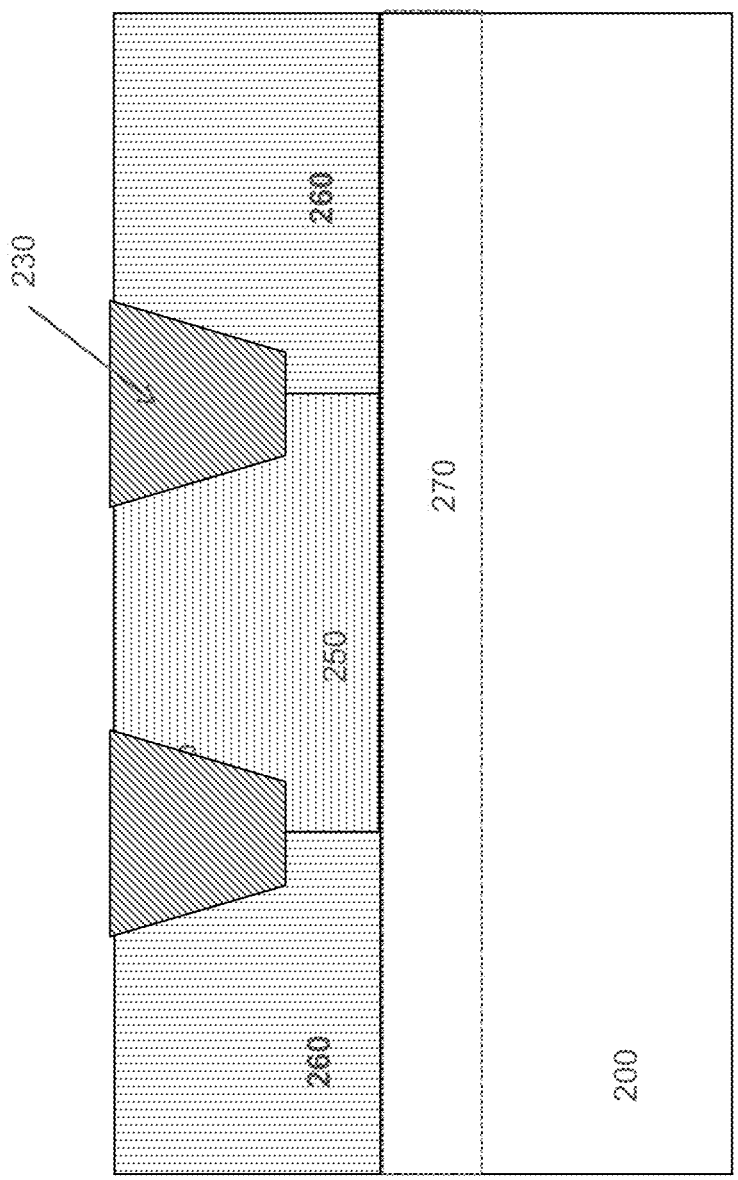

The reverse deep n-well implant and the drive-in anneal process conditions are chosen to form p-type regions 260 which extend to at least the top surface of a p-type base region located below the n-type epitaxial layer. Process conditions such as implant energy and/or drive in time and temperature may be adjusted. In the embodiment shown in FIGS. 2a to 2d, the p-type base region is a p-type bulk substrate. However, it should be appreciated that the present invention is not limited as such and the p-type base region can take other forms. For example, the p-type base region could take the form of a lightly doped p-type epitaxial region 270 that is formed between the n-type epitaxial layer 220 and a high-doped p-type substrate as shown in FIG. 2e.

In one embodiment, boron or a compound thereof such as $BF_2$ is implanted and a drive-in anneal process to diffuse the implanted Boron forming p-type regions 260. Boron has a higher diffusivity compared to common n-type dopants such as Phosphorus and Arsenic. Therefore, assuming the same initial implant depth, a much lower thermal cycle is needed to diffuse a Boron implanted region to a same given depth compared to Phosphorus or Arsenic. This translates to a shorter drive-in time and/or lower drive-in temperature requirement to form a deep n-well using the present invention's counter-doping approach compared to the known method illustrated in FIG. 1. Other advantages that flow from the aforementioned effects such as reduced wafer warpage issues, reduced fabrication cost may also correspondingly result. Additionally, for the same amount of implant energy being supplied Boron can also be injected to a greater depth compared to Arsenic and Phosphorus.

In a comparative experiment carried out by the inventors, a 7 um deep n-well is formed using the present invention's counter-doping approach as well as by the known method in FIG. 1. In the counter-doping approach Boron was used to counter-dope an n-epitaxial layer and form p-type regions. For the known approach sample, Phosphorus was implanted into designated deep n-well regions. Given identical drive-in temperatures of 1150° C., the counter-doped sample required about 5 hours of drive-in time while the known method sample needed 20 hours. Accordingly, it is evident from the experimental results that the present invention can provide a significant reduction in drive-in thermal cycle and therefore, shorter drive-in time and/or temperature.

Figure 3B:
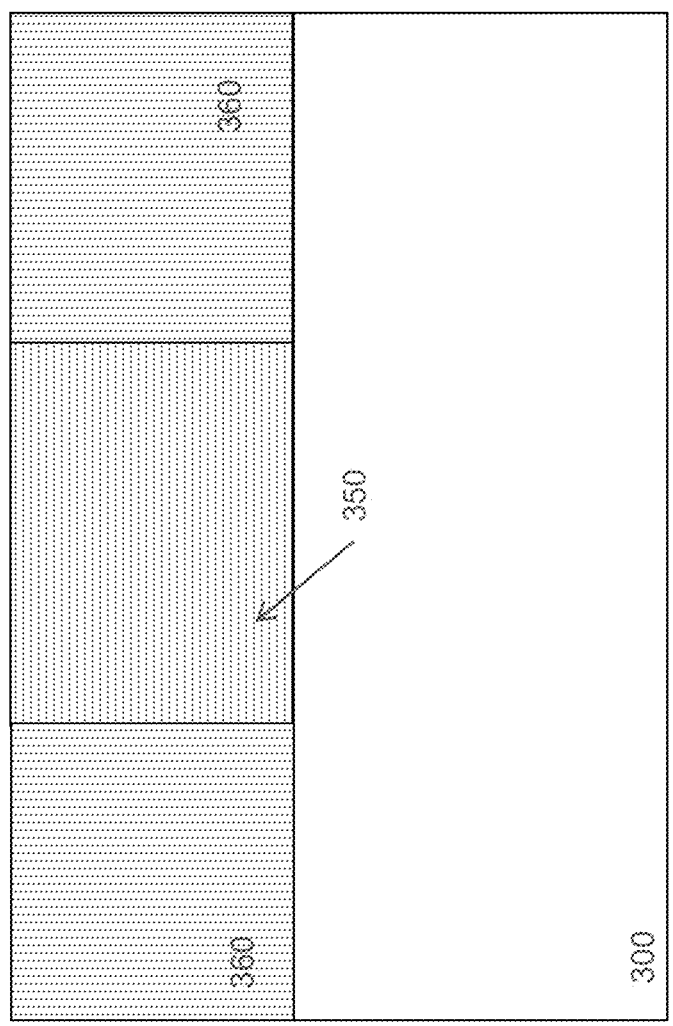

It is not essential for the reverse deep n-well implant and subsequent drive-in anneal processes to be performed in the sequence illustrated in FIG. 2a-2d. For example, in another embodiment illustrated in FIG. 3a-3b, an n-type epitaxial layer 320 is formed over a p-type substrate 300 as in the first embodiment shown in FIG. 2a-2d. However, unlike the first embodiment, a masking layer 340 is formed overlying designated deep n-well regions and a reverse deep n-well implant is carried out to counter dope the non-masked portions of the epitaxial layer 320 prior to the formation of STIs or other device isolation structures (see FIG. 3a). After the reverse deep n-well implant, the masking layer 340 is removed and a drive-in anneal is carried out to diffuse the p-type dopants from the implant. As shown in FIG. 3b, the dopants are driven into the epitaxial layer 230 to form p-type regions 360 that extend to at least the top surface of the underlying p-type substrate 300. The p-type regions may also be of a greater depth than the n-type epitaxial layer and extend into the p-type substrate. The n-type epitaxial region 350 sandwiched between the p-type regions 260 acts as the deep n-well region. Similar to the first embodiment, the reverse deep n-well implant and the drive-in anneal process conditions are chosen to form p-type regions 360 which extend to a depth equal to or greater than the thickness of the n-type epitaxial layer 320. After the formation of the deep n-well 350 and p-type regions 360, additional processing steps may be carried out to form isolation structures such as STI and other device regions.

Figure 4B:
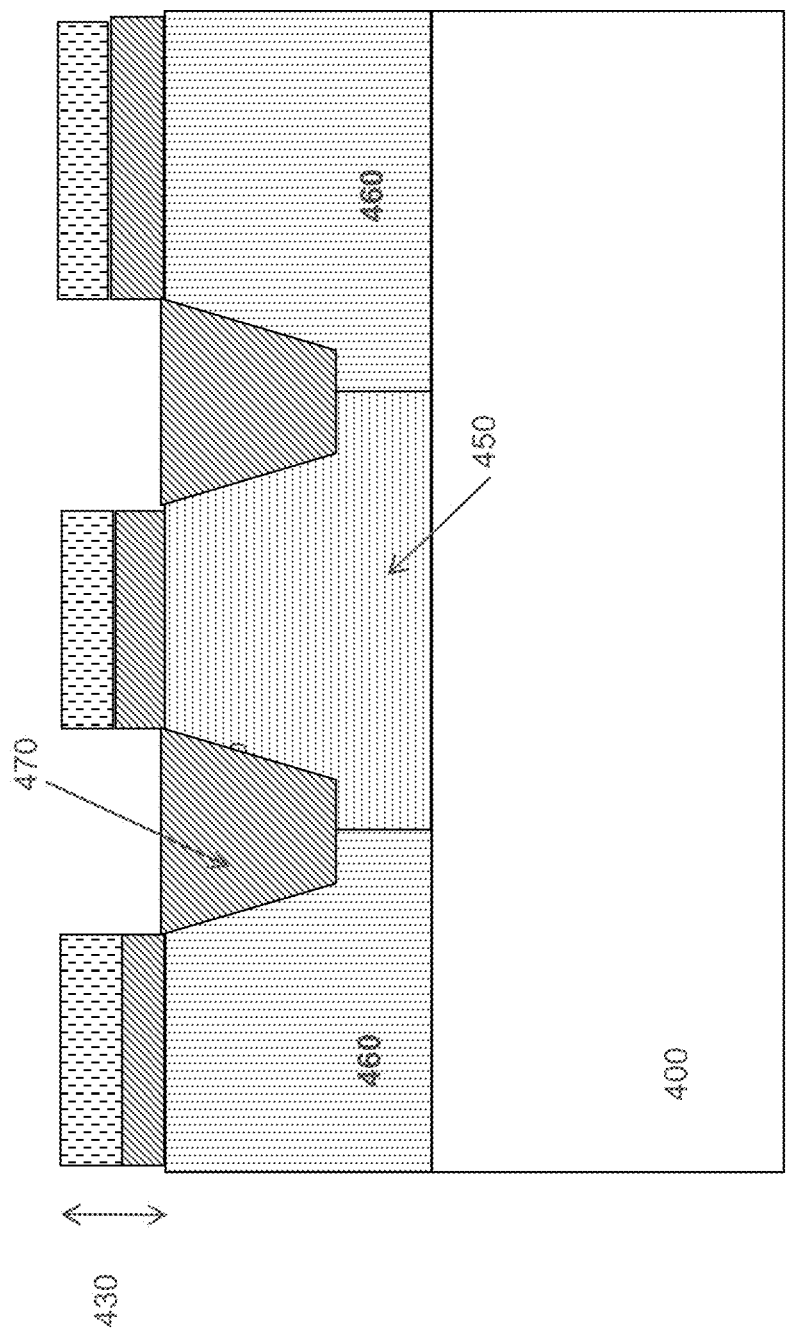

A third embodiment of the invention is illustrated in FIGS. 4a-4b. Referring to FIG. 4a, a substrate 400 is provided. The substrate may comprise a silicon substrate, such as a p-type doped silicon substrate. For example, the substrate may be lightly doped p-type substrate with a resistivity greater than 1 ohm-cm, preferably between 5-15 ohm-cm. A highly doped p-type silicon substrate with a resistivity of less than 0.1 ohm-cm may also be suitable depending on the technical specifications required. An n-type epitaxial layer 420 is formed over the substrate 200. The thickness of the epitaxial layer 220 is chosen based on the desired depth of the subsequently formed deep n-well. In one embodiment, the epitaxial layer 220 has a thickness of between 5-15 μm. Such a depth, for example, may be suitable for devices with an operating voltage of 10-100 V. Other thicknesses may also be suitable depending the type of device to be formed and desired performance parameters. In one embodiment, the epitaxial layer 220 is a lightly doped n-type epitaxial layer.

A first masking layer 430 is formed over the epitaxial layer 420. The first masking layer is to be used as an etch mask to protect the epitaxial layer 420 and substrate 400 during a subsequent STI trench etch process and therefore includes openings which correspond to designated location for STI structures. The first masking layer 430 should also be chosen so as to allow for dopants implanted during the reverse deep n-well to pass there through. In FIG. 4a, the first masking layer 430 is a dual layered structure. It a lower oxide layer and an upper nitride layer. Alternatively, other materials that can performed the above mentioned functions may also suitable. The first masking layer may also comprise more or less than two layers. A second masking layer 440 that overlies n-epitaxial layer areas designated as deep n-well regions is subsequently formed over the substrate. As shown in FIG. 4a, it covers some portions of the first masking layer 430. In one embodiment, the masking layer 440 is a photoresist mask that is formed by depositing a photoresist material over the epitaxial layer 420 and patterning the photoresist material using standard lithographic techniques so that portions of the photoresist material that overlie designated deep n-well regions are retained.

P-type dopants are subsequently implanted into the epitaxial layer 420 in a reverse deep n-well implant process 442. During the reverse deep n-well process, the designated deep n-well regions are shielded by the second masking layer 440 which prevents implanted dopants from penetrating therethrough. As a result, the designated deep n-well regions remain n-type in polarity. On the other hand, areas that are not covered by the second masking layer 440 (including areas that are only covered by the first masking layer 430) are doped by the p-type dopants implanted during the reverse deep n-well implant. The implanted dosage should be sufficient to at least counter dope the epitaxial areas not covered by the second masking layer 440 thus converting them to p-type regions. Additionally, the implant dose may be adjusted to also take into account the resulting p-type region resistivity that is desired. The reverse deep n-well implant process may comprise one or more implant steps. In one embodiment, multiple implants are carried out at different implant energies.

Following the reverse deep n-well implant, a drive-in anneal process is carried out to diffuse the p-type dopants from the implant. The second masking layer may be removed prior to the drive-in anneal depending on whether it is made of a material that can be subjected to the drive-in process. The drive-in process may comprise one or more anneal steps which can be performed in a single equipment or multiple pieces of equipment. In one embodiment, the drive-in anneal is a thermal drive-in performed in a furnace. The anneal can be performed at a temperature of about 1000° C. to 1200° C. Other annealing temperatures and processes may also be suitable.

During the drive-in process, the implanted dopants are driven into the epitaxial layer 420 to form p-type regions 460 that extend to at least the top surface of the underlying p-type substrate 400 as shown in FIG. 4b. The p-type regions may also be of a greater depth than the n-type epitaxial layer and extend into the p-type substrate. The n-type epitaxial region 450 sandwiched between the p-type regions 460 acts as the deep n-well region. The deep n-well depth is therefore determined by the thickness of the epitaxial layer and not implant and drive-in processes like in the prior art.

The reverse deep n-well implant and the drive-in anneal process conditions are chosen to form p-type regions 460 which extend to at least the top surface of a p-type base region located below the n-type epitaxial layer. Process conditions such as implant energy and/or drive in time and temperature may be adjusted. In one embodiment, boron is implanted and subjected to a drive-in anneal process to form p-type regions 460. Boron has a higher diffusivity compared to common n-type dopants such as Phosphorus and Arsenic, therefore a lower thermal cycle is needed for a Boron implanted region to reach the same deep n-well depth compared to the conventional approach of implanting these dopants and driving them to the desired n-well depth. This translates to a shorter drive-in time and/or lower drive-in temperature. Other advantages that flow from the aforementioned effects may also correspondingly result.

Following the drive-in anneal, isolation structures in the form of STI structures 470 are formed. In FIG. 4b, the STI structures are device isolation regions that overlap both the deep n-well and p-type regions (450, 460). The STI structures may be formed by first etching trenches in the deep n-well and p-type regions (450, 460) using the first masking layer 430 as an etch mask to protect non-STI designated areas from being etched. The trenches are subsequently filled with one or more layers of dielectric material such as silicon oxide followed by chemical mechanical polishing (CMP) to remove trench dielectric material residing outside of the trenches and provide a planar top surface for the STI. Alternatively, other processes or materials can also be used to form the STIs. The depth of the STIs may be, for example, about 3000-4500 Å. Other depths for the STIs may also be useful and isolation trenches that are of the same depth or deeper than the deep n-well may also be formed. Furthermore, it is also to be appreciated that other forms of isolation region such as deep trench isolation and LOCOS structures may also be used in place of STI structures.

Although the preceding embodiments all include a drive-in anneal process to diffuse the implanted p-type dopants, it is not an essential process in the formation of all n-well structures. For example, if a shallow n-well is needed, the p-type dopants may be injected to the desired depth just based on the reverse deep n-well implant.

Figure 5:
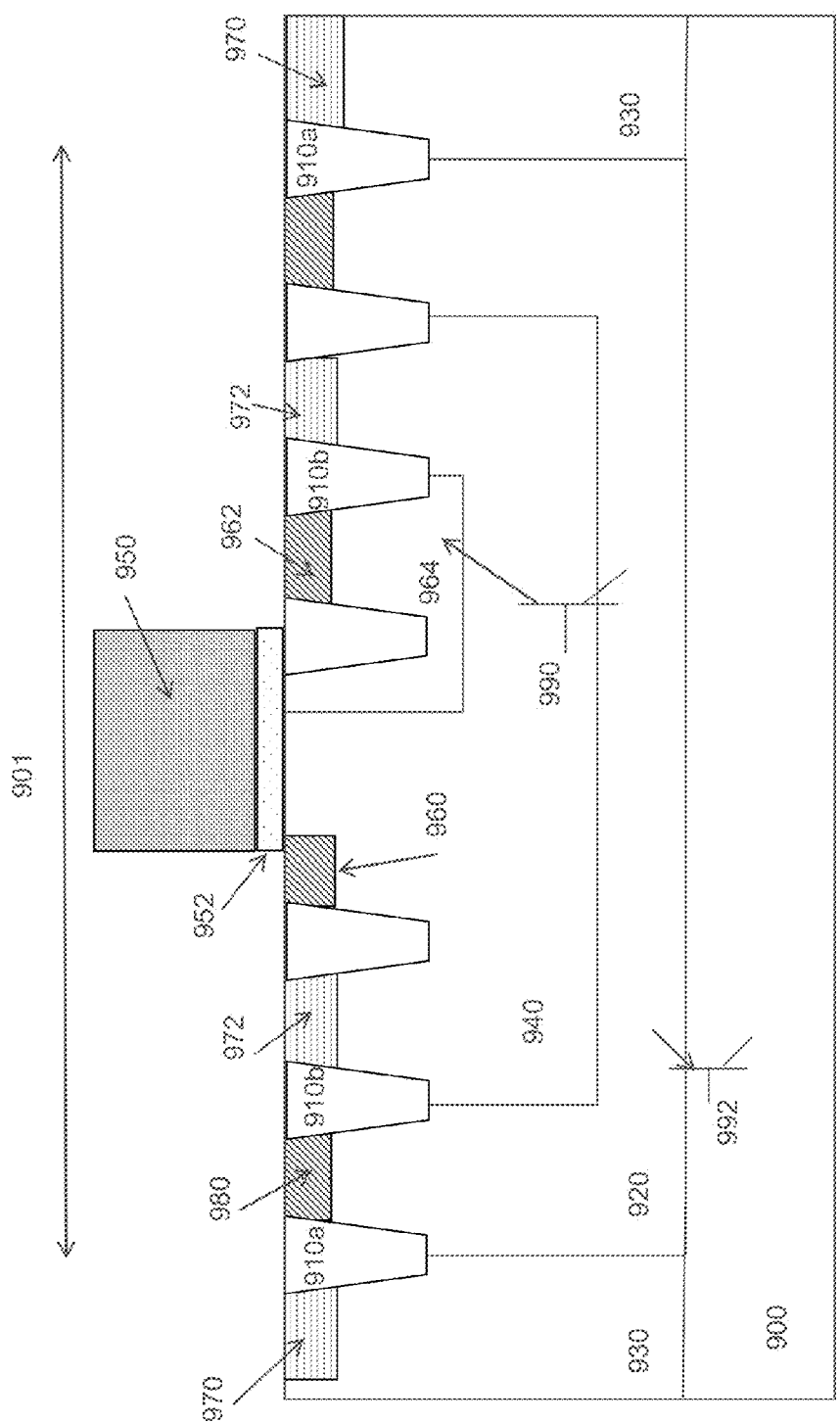
FIG. 5 is a schematic cross-sectional view of a high voltage device in accordance with one embodiment of the invention.

FIG. 5 shows a cross-sectional view of a n-type high voltage device 901 in accordance with one embodiment of the invention. The device 901 is formed on a p-type substrate 900 and it includes a deep n-well 920 that is bounded on both sides by p-type regions 930 that have at least the same depth as the deep n-well 920 so that the deep n-well is isolated from neighboring deep n-well regions (not shown). The deep n-well 920 is formed from an n-type epitaxial layer deposited over the substrate 900 while the p-type regions 930 are counter-doped portions of the same n-type epitaxial layer. The deep n-well 920 and p-type regions may be formed using methods such as those described earlier in relation to FIGS. 2-4. Isolation structures in the form of STIs are provided for isolating or separating different regions of the substrate. For example, STI structures 910a located between the deep n-well 920 and p-type region 930 surround the device 901 and they function as device isolation regions that separate the device 901 from the surrounding p-type region. STI structures 910b, on the other hand, are located within they device and they separate the device into sub-regions.

The high voltage device 901 further includes a high voltage p-well 940 formed within the deep n-well 920 with STI structures 910b separating a top portion of the high voltage p-well 940 from the deep n-well 920. A gate comprising a gate electrode 950 and a gate dielectric 952 is also provided above the top surface of the high voltage p-well with a source region 960 and a drain region 962 disposed in the high voltage p-well adjacent to opposed sides of the gate. The gate electrode may comprise a polysilicon or metallic material while the gate dielectric may be in the form of a silicon oxide, silicon nitride, or high k dielectric material or a combination thereof. Alternatively, other materials may also be suitable.

In FIG. 5, the source region 960 overlaps an edge of the gate while the drain region 962 is located proximate an opposed side of the gate and separated therefrom by an STI 910b. Both the source and drain are n-type in polarity with the drain region being encompassed within an n-type drift region 964 formed within the high voltage p-well 940. The n-type drift region 964 may under-lap a portion of the gate. In one embodiment, the source and drain are highly doped n-type regions while the drift region is a lightly doped or intermediately doped n-type region. The source and drain regions may have an implanted dose of about $1E15$-$1E17/cm^2$ and the drift region an implanted dose of about $1E11$-$1E13/cm^2$. Other doping concentration may also suitable depending on device performance requirements. The depth of the source and drain regions may be about 0.05 to 0.5 μm. Providing source and drain regions having other depths may also be useful.

A number of p-type contact regions (970, 972) are provided to allow for electrical contact and/or bias to be made to the p-type region 930, and high voltage p-well 940. N-type contact regions 980 are also provided for the same purpose but with respect to the deep n-well. In one embodiment, the contact regions are highly doped regions.

Figure 6B:
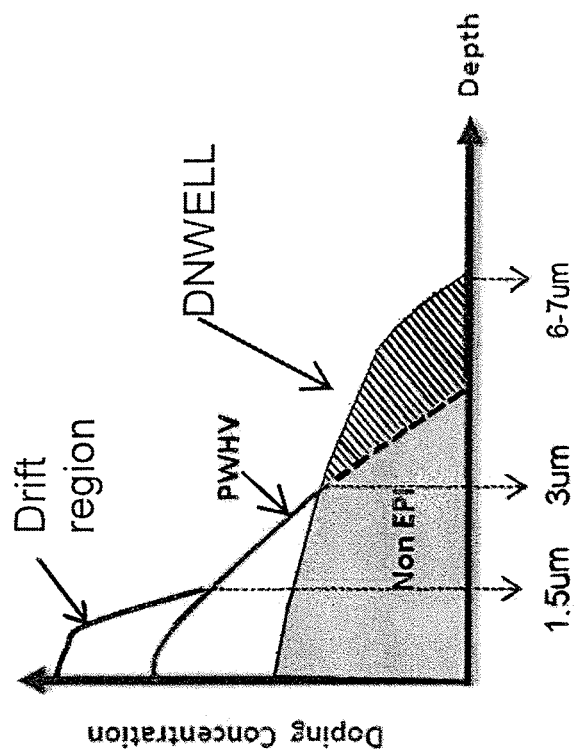
FIGS. 6a and 6b shows the doping concentration profile of a device formed in accordance with one embodiment of the invention and formed using known methods respectively.
Figure 6A:
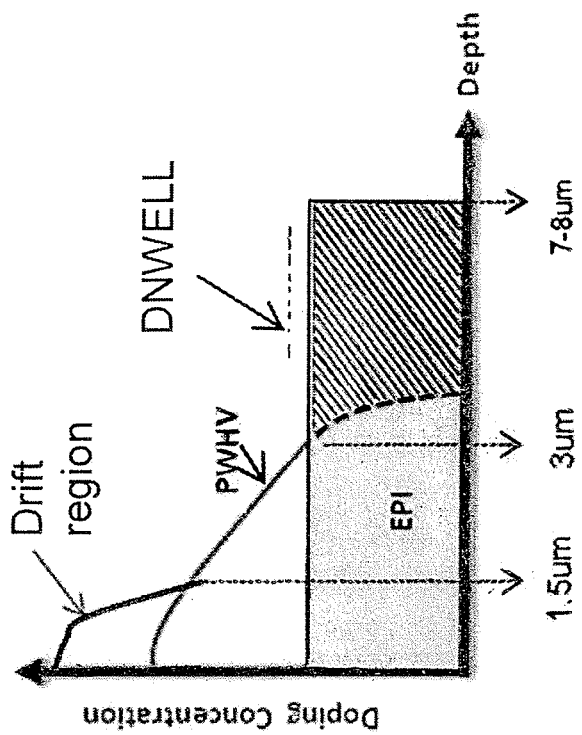

FIG. 6a shows the doping concentration profile with an exemplary device with the structure shown in FIG. 5 where the deep n-well is formed from an n-type epitaxial layer and the p-type regions are counter-doped portions of the same n-type epitaxial layer. As evident from FIG. 6a, the deep n-well can have a constant n-type doping throughout since it is formed from an epitaxial layer. By contrast, the deep n-well profile in FIG. 6b shows a dopant concentration that decreases with depth. This is because the doping concentration profile shown in FIG. 6b is of a device which has a similar structure to that of the FIG. 6a device but with a deep n-well that is formed by implanting n-type dopants into a substrate followed by drive-in process. The implant and drive-in method is not capable of forming a deep n-well with a constant doping concentration. A result of having a constant doping concentration is that a higher dopant concentration can be obtained in a deep n-well portion of a device compared to the case where the deep n-well is implanted.

Figure 7A:
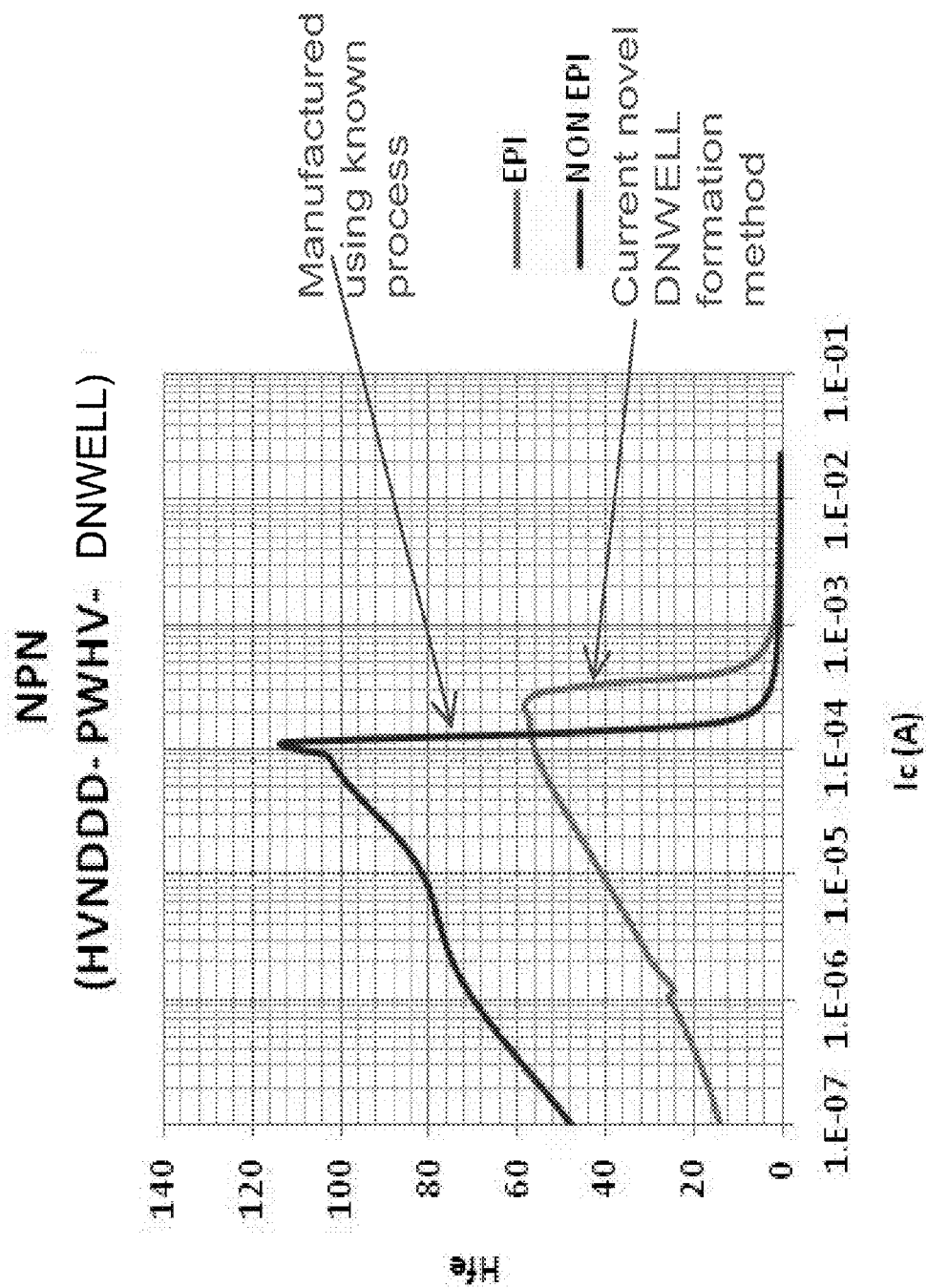
FIGS. 7a and 7b are gain versus collector current characteristics corresponding to the devices of FIGS. 6a and 6b respectively.
Figure 7B:
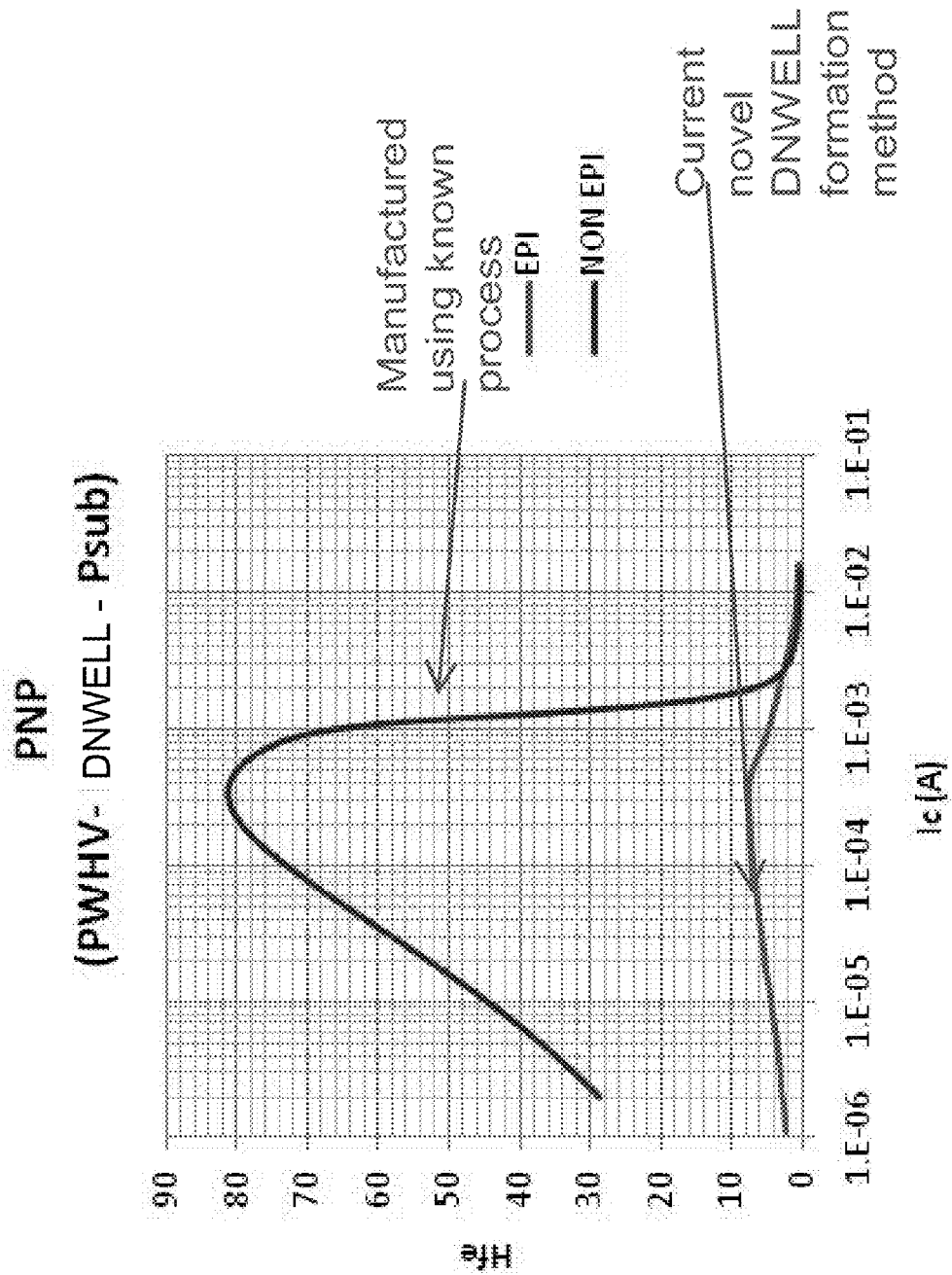

A high deep n-well doping concentration has its benefits in terms of reducing parasitic bipolar current gain which translates to reduced transient current noise and/or better latchup immunity. Due to differences in polarity, a parasitic vertical NPN bipolar transistor 990 and a parasitic vertical PNP transistor 992 typically exist in the structure of FIG. 5. The parasitic NPN 990 comprises the drift region as the emitter, the high voltage p-well as the base and the deep n-well as the collector. The deep n-well forms the base of the vertical PNP 992 while the high voltage p-well and substrate forming the emitter and collector respectively. FIGS. 7a and 7b illustrate the gain versus collector current of the parasitic NPN and PNP BJT associated with the devices of FIGS. 6a and 6b. As evident from the results, the gain of both parasitic BJTs are lower for the device of FIG. 6a where the deep n-well is formed from an n-type epitaxial layer.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A method for fabricating a device comprising:
providing a substrate without doped regions which serve as buried doped regions, wherein the substrate comprises a planar top surface;
forming a doped epitaxial layer over and contacts the planar top surface of the substrate, wherein the doped epitaxial layer includes first polarity type dopants and a planar top epitaxial surface, the doped epitaxial layer includes a device region which corresponds to a device isolation well for a device in the device region, and a thickness of the doped epitaxial layer defines a depth of the device isolation well;
selectively counter-doping a portion of the doped epitaxial layer to form a counter-doped region adjacent to the device region formed by the doped epitaxial layer, wherein the counter doped region extends from the planar top epitaxial surface to at least the planar top surface of the substrate;
forming a trench isolation region, the trench isolation region isolates the device region; and
forming the device over and contacts the planar top epitaxial surface in the device region.

2. The method of claim 1 wherein selectively counter-doping comprises selectively implanting second polarity type dopants into an exposed portion of the doped epitaxial layer.

3. The method of claim 1 wherein selectively counter-doping further comprises performing a drive-in anneal process to diffuse the implanted second polarity type dopants.

4. The method of claim 1 wherein the substrate comprises a lightly doped p-type substrate.

5. The method of claim 4 wherein the substrate comprises a resistivity of greater than 1 ohm-cm.

6. The method of claim 4 wherein forming the substrate comprises a resistivity of 5-15 ohm-cm.

7. The method of claim 1 wherein the substrate comprises a highly doped p-type substrate.

8. The method of claim 1 wherein:
the first polarity type comprises n-type; and
the second polarity type comprises p-type.

9. The method of claim 8 wherein the trench isolation region is formed prior to selectively counter-doping a portion of the doped epitaxial layer and wherein the trench isolation region comprises a top surface which is coplanar with the planar top epitaxial surface.

10. The method of claim 7 wherein the substrate comprises a resistivity of less than 0.1 ohm-cm.

11. The method of claim 1 wherein forming the device comprises forming a first polarity type transistor in the device region.

12. The method of claim 1 wherein forming the device comprises forming a first polarity type lateral diffused transistor.

13. A method for fabricating a device comprising:
providing a substrate without doped regions which serve as buried doped regions, wherein the substrate comprises a planar top surface;
depositing an n-type epitaxial layer over the planar top surface of substrate, the n-type epitaxial layer having a planar top epitaxial surface;
forming a first masking layer over and contacts the planar top epitaxial surface, wherein the first masking layer protecting a designated n-well region in the epitaxial layer, and wherein a thickness of the n-type epitaxial layer defines a depth of the n-well region;
forming a p-type region in a portion of the n-type epitaxial layer unprotected by the first masking layer by implanting p-type dopants to counter-dope the unprotected portion, wherein the p-type region surrounds the designated n-well region and extends from the planar top epitaxial surface through the n-type epitaxial layer to make contact with the substrate;
wherein the designated n-well region is not recessed with respect to a top epitaxial surface; and
removing the first masking layer.

14. The method of claim 13 wherein forming the p-type region further comprises performing a drive-in anneal process to diffuse the implanted p-type dopants.

15. A method of fabricating a device comprising:
providing a substrate without doped regions which serve as buried doped regions, wherein the substrate comprises a planar top surface;
forming an epitaxial layer over the planar top surface of the substrate, wherein the epitaxial layer comprises a doped epitaxial layer with first polarity type dopants and a planar top epitaxial surface, the doped epitaxial layer includes a first device region which corresponds to a device isolation well for a device in the first device region, and a thickness of the doped epitaxial layer defines a depth of the device isolation well;
forming a counter-doped region adjacent to the first device region formed by the doped epitaxial layer, wherein the counter-doped region extends from the planar top epitaxial surface to at least the planar top surface of the substrate; and
wherein providing the device isolation well from the doped epitaxial layer avoids recessing the top surface of the epitaxial surface in the device region which results from conventional processing to form the device isolation well.

16. The method of claim 15 wherein the substrate comprises a highly doped p-type substrate.

17. The method of claim 16 wherein the substrate comprises a resistivity of less than 0.1 ohm-cm.

18. A method for fabricating a device comprising:
providing a substrate without doped regions which serve as buried doped regions, wherein the substrate comprises a planar top surface;
forming a first polarity type epitaxial layer over the planar top surface of the substrate, the epitaxial layer having a planar top epitaxial surface;
selectively counter-doping portions of the same epitaxial layer to form a second polarity type region that extends from the planar top epitaxial surface through the epitaxial layer to make contact with the substrate, the second polarity type region surrounds an area of the epitaxial layer that is not counter-doped;
wherein the surrounded area of the epitaxial layer that is not counter-doped functions as a first polarity well region of a device region, wherein a thickness of the epitaxial layer determines a depth of the first polarity well region, and
wherein the first polarity well region of the device region is not recessed below the planar top epitaxial surface.

19. The method of claim 18 wherein the substrate comprises a lightly doped p-type substrate.

20. The method of claim 19 comprising forming the device having a gate structure which contacts the planar top epitaxial surface over the first polarity well region.

* * * * *